US009842920B1

(12) United States Patent
Jeon et al.

(10) Patent No.: US 9,842,920 B1
(45) Date of Patent: Dec. 12, 2017

(54) GALLIUM NITRIDE SEMICONDUCTOR DEVICE WITH ISOLATED FINGERS

(71) Applicant: SEMICONDUCTOR COMPONENTS INDUSTRIES, LLC, Phoenix, AZ (US)

(72) Inventors: Woochul Jeon, Phoenix, AZ (US); Chun-Li Liu, Scottsdale, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/208,456

(22) Filed: Jul. 12, 2016

(51) Int. Cl.
*H01L 29/66* (2006.01)
*H01L 29/778* (2006.01)
*H01L 29/20* (2006.01)
*H01L 29/06* (2006.01)
*H01L 29/423* (2006.01)
*H01L 29/417* (2006.01)
*H01L 23/50* (2006.01)

(52) U.S. Cl.
CPC ............ *H01L 29/778* (2013.01); *H01L 23/50* (2013.01); *H01L 29/0696* (2013.01); *H01L 29/2003* (2013.01); *H01L 29/41758* (2013.01); *H01L 29/41775* (2013.01); *H01L 29/4238* (2013.01); *H01L 29/42376* (2013.01)

(58) Field of Classification Search
CPC ............ H01L 29/778; H01L 29/42376; H01L 29/41775; H01L 29/41758
USPC .......................................................... 257/194
See application file for complete search history.

(56) References Cited

U.S. PATENT DOCUMENTS

| 7,982,243 | B1* | 7/2011 | Iversen | ............... H01L 29/0692 257/202 |
| 9,536,966 | B2* | 1/2017 | Ogino | ................. H01L 29/7786 |
| 2007/0120153 | A1* | 5/2007 | Williams | ............ H01L 21/8252 257/280 |
| 2012/0138950 | A1 | 6/2012 | Roberts et al. | |
| 2012/0280280 | A1* | 11/2012 | Zhang | ................. H01L 29/7786 257/194 |

* cited by examiner

*Primary Examiner* — Anthony Ho
(74) *Attorney, Agent, or Firm* — IPTechLaw

(57) ABSTRACT

Implementations of semiconductor devices may include: an isolated drain finger, a gate ring, and a source ring; wherein the gate ring surrounds a perimeter of the isolated drain finger; wherein the source ring surrounds an outer perimeter of the gate ring and the isolated drain finger; wherein a gate bus is coupled to the gate ring; wherein a first electrically insulative portion is located between the isolated drain finger and the gate ring; and wherein a second electrically insulative portion is located between the gate and the source ring.

13 Claims, 5 Drawing Sheets

GALLIUM NITRIDE SEMICONDUCTOR DEVICE WITH ISOLATED FINGERS

BACKGROUND

1. Technical Field

Aspects of this document relate generally to semiconductor device, and more particularly, to gallium nitride transistors.

2. Background

Conventionally, gallium nitride (GaN) semiconductor devices have drain, source, and gate regions which are in the form of interdigitated fingers. GaN devices are used in high power and high frequency circuit applications.

SUMMARY

Implementations of semiconductor devices may include: an isolated drain finger, a gate ring, and a source ring; wherein the gate ring surrounds a perimeter of the isolated drain finger; wherein the source ring surrounds an outer perimeter of the gate ring and the isolated drain finger; wherein a gate bus is coupled to the gate ring; wherein a first electrically insulative portion is located between the isolated drain finger and the gate ring; and wherein a second electrically insulative portion is located between the gate and the source ring.

Implementations of semiconductor devices may include one, all, or any of the following:

The semiconductor device may further include a contact in each of the isolated drain finger, the gate ring and the source ring.

The device may be a high electron mobility transistor (HEMT).

The gate bus may be coupled to the gate ring through a contact in the middle of the gate ring.

The gate bus may be coupled to the gate ring at an edge of the ring through a contact crossing the source ring.

An active area of the device may be inside the source ring.

An active area of the device may include the source ring.

An active area of the device may end at an edge of the isolated drain finger.

Implementations of semiconductor devices may include an isolated source finger, a gate ring surrounding the isolated source finger; a drain ring surrounding the gate ring; a guard ring surrounding the drain ring; a gate bus coupled to the gate ring; a first electrically insulative portion between the gate ring and the source ring; and a second electrically insulative portion between the drain ring and the gate ring.

Implementations of semiconductor devices may include one, all, or any of the following:

The device may be a high electron mobility transistor (HEMT).

The semiconductor device may further include a contact in each of the isolated drain finger, the gate ring and the source ring.

An active area of the device may be located inside the drain ring.

An active area of the device may include the drain ring.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended gallium nitride semiconductor devices will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such gallium nitride semiconductor devices and implementing components and methods, consistent with the intended operation and methods.

Figure 1:
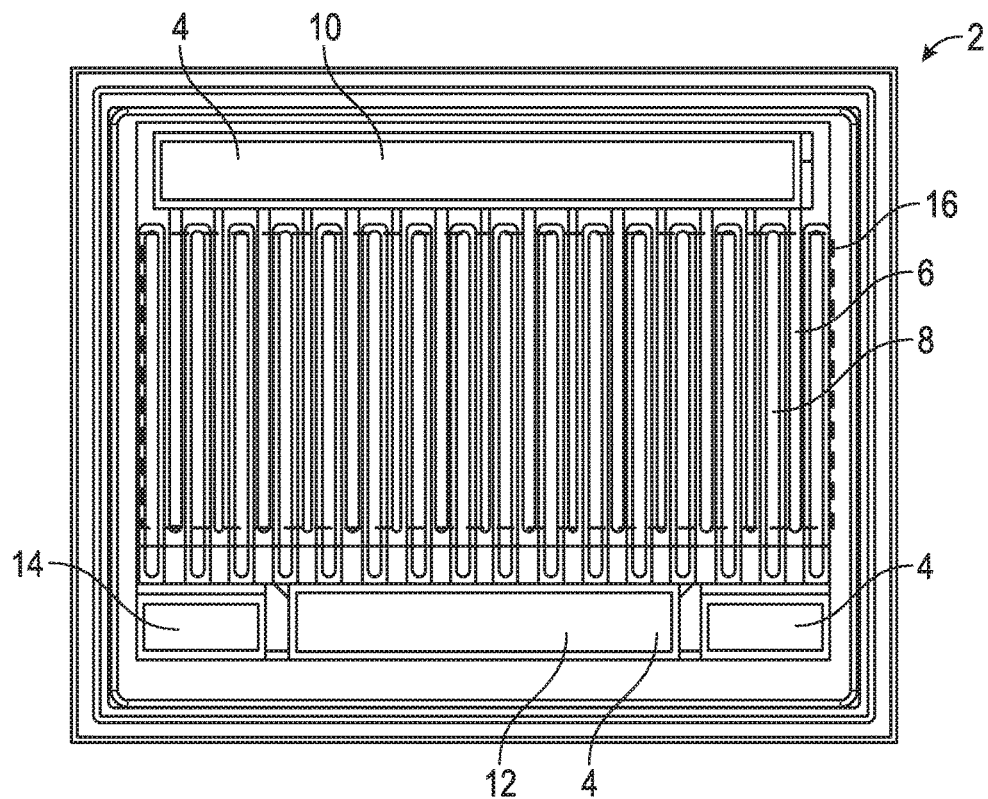
FIG. 1 is a top view of a conventional non-bond-over-active area (BOA) semiconductor device.

Referring to FIG. 1, a conventional semiconductor device 2 with non-bond-over-active area (BOA) bond pads 4 is illustrated. Interdigitated drain fingers 6 and source fingers 8 are positioned between the drain pad 10, source pad 12 and gate pads 14. A boundary of isolation 16 is surrounds the active area of the device between the fingers 6, 8 and bond pads 4. An increase in leakage current can occur at the boundary of isolation and at the edge of the drain fingers 6 and source fingers 8. Leakage may cause a higher on resistance (Ron) and an increased switching loss during operation of the device.

Figure 2:
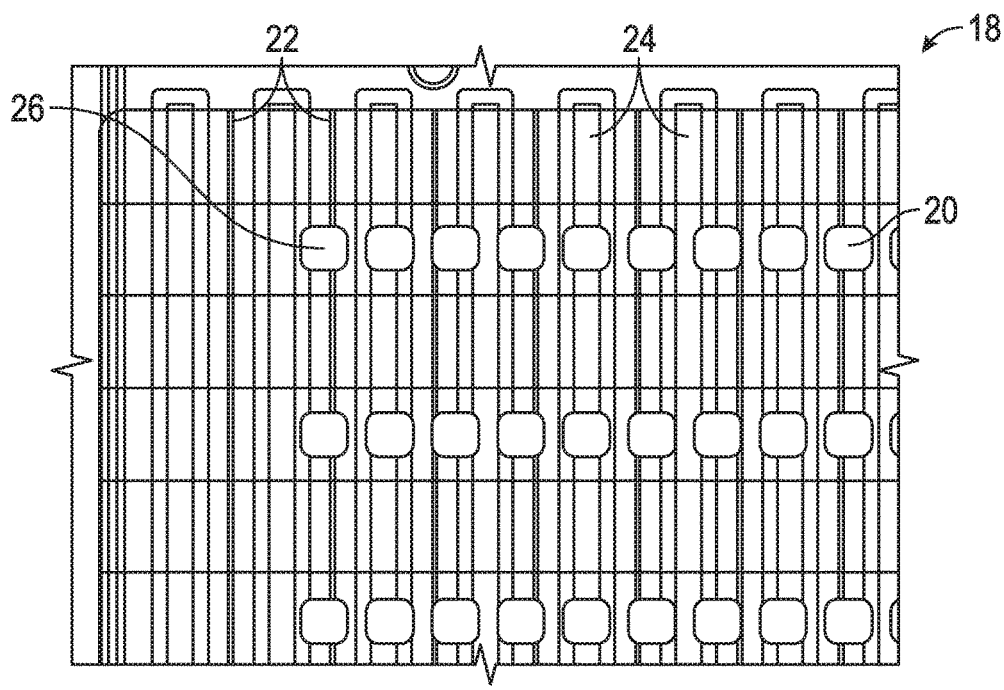
FIG. 2 is a top view of a conventional BOA semiconductor device.

Referring to FIG. 2, a conventional semiconductor device 18 with bond over active (BOA) pads 20 is illustrated. This circuitry design also has interdigitated source fingers 22 and drain fingers 24. In this device leakage current may occur at the edge of the fingers 22 and 24 and under the drain pads 26 where there is high electric field concentration during operation. Leakage may cause any of the aforementioned issues during operation of the device.

Figure 3:
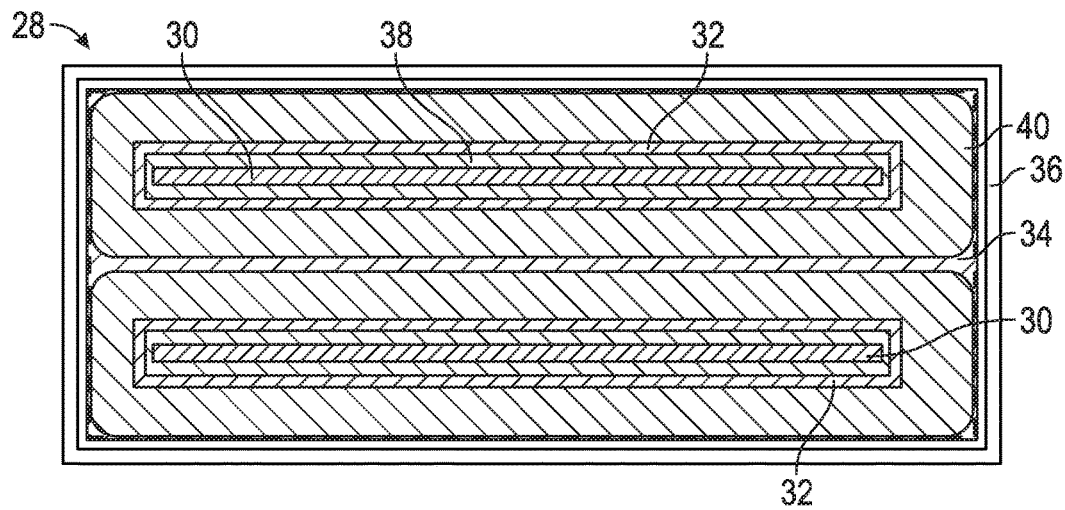
FIG. 3 is a top view of an implementation of an isolated source finger semiconductor device with a guard ring.

Referring now to FIG. 3, a top view of an implementation of a semiconductor device 28 with an isolated and/or electrically isolated source finger 30 is illustrated. The isolated source finger 30 may take up minimal space in the device. As illustrated, a gate ring 32 surrounds the source finger 30 and a drain ring 34 surrounds the gate ring 32. A guard ring 36 surrounds the drain ring 34. As illustrated, a first electrically insulative portion 38 is located between the isolated source finger 30 and the gate ring 32. A second electrically insulative portion 40 is located between the gate ring 32 and the drain ring 34. The dimensions of the second insulative portion 40 are large enough to isolate two metals because of the high potential of the drain ring 34. A gate bus may be coupled to the gate ring 32 through a contact in the middle of the gate ring.

A minimal source finger 30 size may lead to lower capacitance between the ground and the source of the device. It may also lead to lower capacitance between the source and the substrate. The size of the source finger 30 may also allow faster switching and low switching loss. In the illustrated implementation, the guard ring 36 is used for edge termination because the high voltage drain ring 34 is outside the outer ring in the device 28. When used in a cascode device, this structure may allow for switching at the source and coupling the gate to a ground.

Figure 4A:
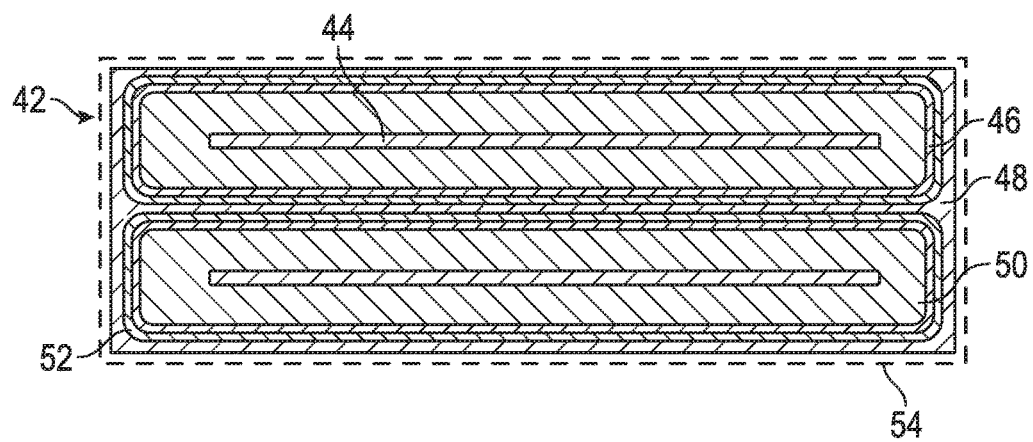
FIGS. 4A-4C are top views of implementations of isolated drain finger semiconductor devices.
Figure 4B:
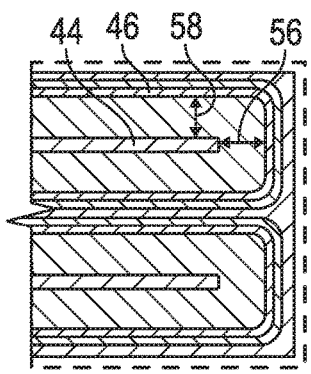
Figure 4C:
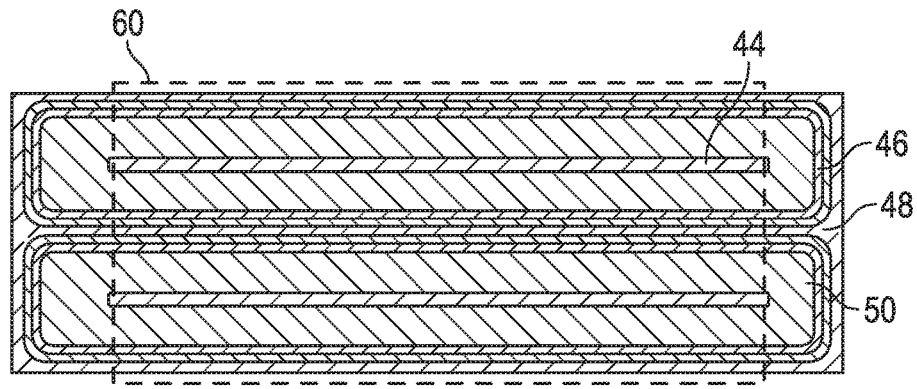

Referring now to FIG. 4A-4C, an implementation of a semiconductor device 42 with an isolated and/or electrically isolated drain finger 44 is illustrated. In this implementation, the isolated drain finger 44 is surrounded by a gate ring 46 which is surrounded by a source ring 48. Surrounding the isolated drain finger 44 with the gate ring 46 and source ring 48 may reduce leakage current compared to a conventional semiconductor device (FIGS. 1 and 2). As voltage is applied to the device, the gate and source rings 46, 48 may block the flow of current from the isolated drain finger 44. A first insulative portion 50 large enough to isolate two metals is located between the isolated drain finger 44 and the gate ring 46. A second insulative portion 52 is located between the gate ring 46 and the source ring 48. In implementations using the structure illustrated in FIGS. 4A-4C, the structure may decrease the capacitance between the drain and the substrate when compared to a conventional device.

The active area of a device having isolated drain 44 or source fingers 30 may include all the ring area 54 or it may end at the edge of the isolated finger 44 and 30 as in FIG. 4C. When the active area extends outside the finger area, the channel can be shut off with the cut-off voltage applied to the gate and the source. Referring to FIG. 4B, when the active area includes all the ring area, the distance 56 between the isolated drain finger 44 and the gate ring 46 at the edge of the isolated drain finger 44 should be longer than the distance 58 between the isolated drain finger 44 and the gate ring 46 at the side 58 of the isolated drain finger 44.

Referring now to FIG. 4C, the active area 60 may end at the edge of the isolated island finger. However, if the isolation process does not completely close the channel outside of the active area there may be leakage currents through the boundary and non-active area (from the drain tip to the source and/or gate). As the two dimensional electron gas (2DEG) is modified and almost removed during the isolation process, the applied gate source bias cannot completely shut off the channel. In various implementations, the same principles disclosed in this document for using various rings can be used by those of ordinary skill in the art to create isolated source fingers, which operate similarly (though in the opposite mode) from the isolated drain fingers. This leakage increase may also be used in a cascode Gallium Nitride (GaN) device, by non-limiting example.

Figure 5A:
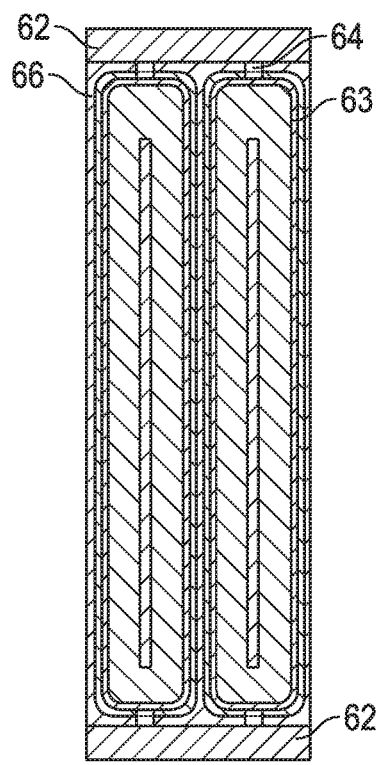
FIGS. 5A-5C are top views of implementations of gate buses coupled to the gate rings of semiconductor devices.
Figure 5B:
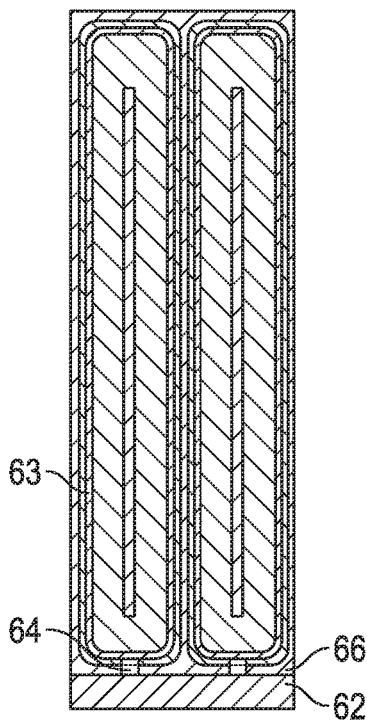
Figure 5C:
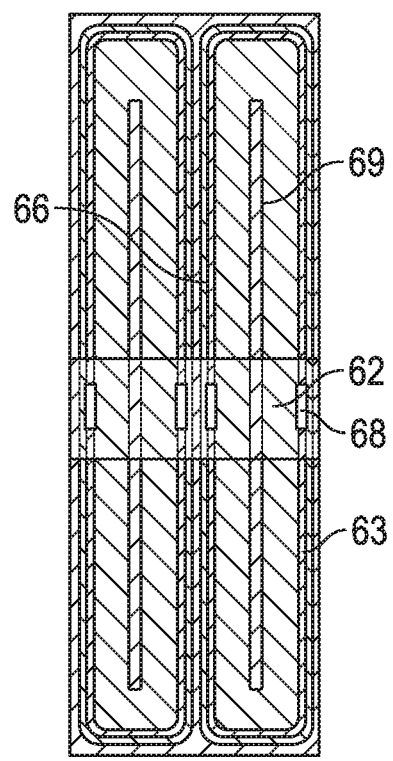

Referring now to FIGS. 5A-5C, the possible locations of a gate bus 62 are illustrated. In FIGS. 5A and 5B, gate buses 62 located at the edge of the device are illustrated. In this configuration, the gate bus 62 is coupled to the gate ring 63 through a lateral via 64 over the ohmic contact of the source ring 66. One or more gate buses 62 can be connected to the device in this way. Referring now to FIG. 5C, the gate bus 62 may also be located in the middle of the device extending over the drain finger 69 and source rings 66. In this configuration, the contacts 68 between the gate ring 63 and gate bus 62 are in the middle of the gate ring 63. The gate buses can be similarly positioned on a device having an isolated source finger 30.

Figure 6A:
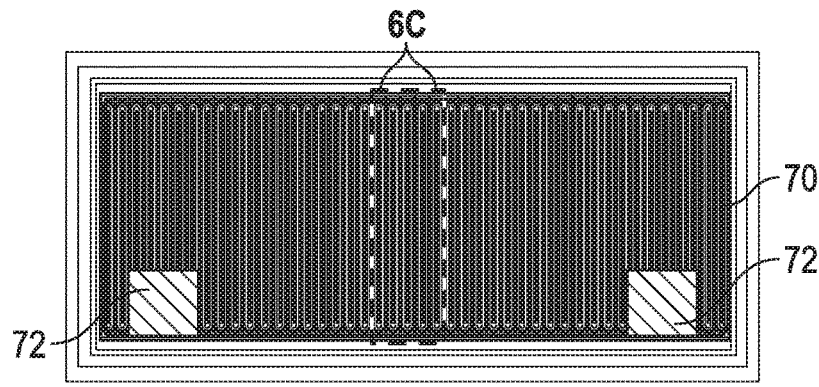
FIGS. 6A-6C are top views of implementations of semiconductor devices having isolated drain fingers.
Figure 6B:
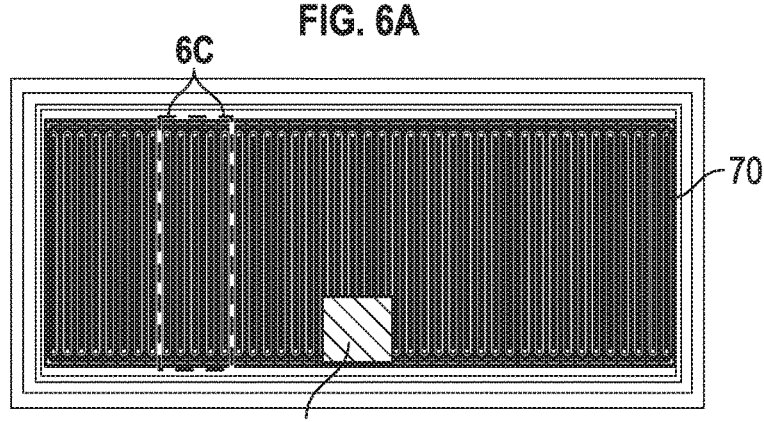
Figure 6C:
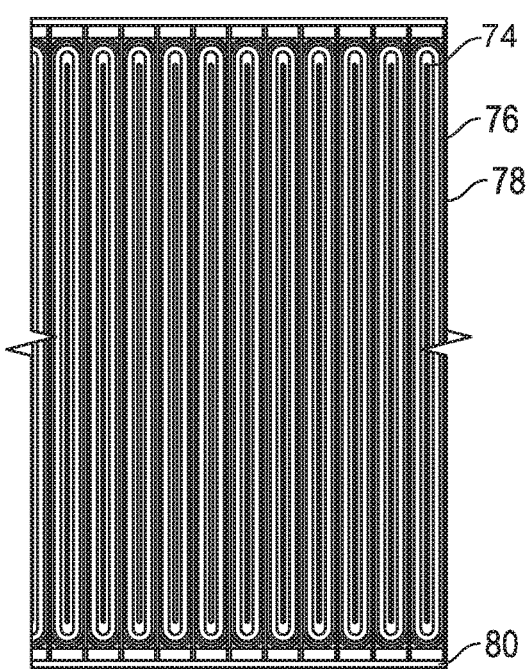

Referring now to FIG. 6A-6C, implementations of a semiconductor device having isolated drain fingers are illustrated. In FIGS. 6A and 6B, possible layouts for a bond over active (BOA) semiconductor device are illustrated. A drain pad may be located over the top of the device and a source pad may be located over the bottom of the device around the gate pad(s) 72. In FIG. 6A, the device layer 70 and two gate pads 72 are illustrated. In FIG. 6B, the device layer 70 and a single gate pad is illustrated. In FIG. 6C, an enlarged view of the individual cells having an isolated drain finger 74, a gate ring 76, and a source ring 78 are illustrated. In this implementation, two gate buses 80 are used on either side of each isolated finger combination device as described in FIG. 5A.

By non-limiting example the devices described herein may be high electron mobility transistors (HEMT). The HEMT may be formed from gallium nitride GaN. The devices may be formed by suitable method known in the art, such as by non-limiting example, metal organic chemical vapor deposition (MOCVD), dry etching and surface passivation. Contacts between the device region and the pad region of a semiconductor device may be located in the each of the isolated source ring, the gate ring, and the drain ring. The minimum size of the isolated fingers may be decided by the minimum ohmic contact size.

In places where the description above refers to particular implementations of semiconductor devices and implementing components, sub-components, methods and sub-methods, it should be readily apparent that a number of modifications may be made without departing from the spirit thereof and that these implementations, implementing components, sub-components, methods and sub-methods may be applied to other semiconductor devices.

What is claimed is:

1. A semiconductor device comprising:
   a single isolated drain finger, a gate ring and a source ring;
   wherein the gate ring completely surrounds a perimeter of the isolated drain finger, forming a closed shape around the drain finger;
   wherein the source ring completely surrounds an outer perimeter of the gate ring and the isolated drain finger, forming a second closed shape around the gate ring and isolated drain finger;
   wherein a gate bus is coupled to the gate ring;
   wherein a first electrically insulative portion is located between the isolated drain finger and the gate ring; and
   wherein a second electrically insulative portion is located between the gate ring and the source ring.

2. The semiconductor device of claim 1, further comprising a contact in each of the isolated drain finger, the gate ring and the source ring.

3. The semiconductor device of claim 1, wherein the device is a high electron mobility transistor (HEMT).

4. The semiconductor device of claim 1, wherein the gate bus is coupled to the gate ring through a contact in the middle of the gate ring.

5. The semiconductor device of claim 1, wherein the gate bus is coupled to the gate ring at an edge of the ring through a contact crossing the source ring.

6. The semiconductor device of claim 1, wherein an active area of the device is inside the source ring.

7. The semiconductor device of claim 1, wherein an active area of the device includes the source ring.

8. The semiconductor device of claim 1, wherein an active area of the device ends at an edge of the isolated drain finger.

9. A semiconductor device comprising:
   an isolated source finger,
   a gate ring surrounding the isolated source finger,
   a drain ring surrounding the gate ring,
   a guard ring surrounding the drain ring;
   a gate bus coupled to the gate ring;

a first electrically insulative portion between the gate ring and the source ring; and a second electrically insulative portion between the drain finger and the gate ring.

10. The semiconductor device of claim 9, wherein the device is a high electron mobility transistor (HEMT).

11. The semiconductor device of claim 9, further comprising a contact in each of the isolated drain finger, the gate ring and the source ring.

12. The semiconductor device of claim 9, wherein an active area of the device is inside the drain ring.

13. The semiconductor device of claim 9, wherein an active area of the device includes the drain ring.

\* \* \* \* \*